US011031681B2

United States Patent
Vincent et al.

(10) Patent No.: US 11,031,681 B2
(45) Date of Patent: Jun. 8, 2021

(54) PACKAGE INTEGRATED WAVEGUIDE

(71) Applicant: NXP USA, INC., Austin, TX (US)

(72) Inventors: Michael B. Vincent, Chandler, AZ (US); Scott M. Hayes, Chandler, AZ (US); Zhiwei Gong, Chandler, AZ (US); Stephen Ryan Hooper, Mesa, AZ (US); Pascal Oberndorff, Nijmegen (NL); Walter Parmon, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 139 days.

(21) Appl. No.: 16/446,861

(22) Filed: Jun. 20, 2019

(65) Prior Publication Data
US 2020/0403298 A1   Dec. 24, 2020

(51) Int. Cl.
*H01Q 1/32* (2006.01)
*H01L 23/66* (2006.01)
*H01L 23/498* (2006.01)
*H01Q 1/22* (2006.01)
*H01Q 13/20* (2006.01)
*H01L 23/00* (2006.01)

(52) U.S. Cl.
CPC ..... *H01Q 1/3233* (2013.01); *H01L 23/49811* (2013.01); *H01L 23/66* (2013.01); *H01L 24/16* (2013.01); *H01Q 1/2283* (2013.01); *H01Q 13/20* (2013.01); *H01L 2223/6677* (2013.01); *H01L 2224/16227* (2013.01)

(58) Field of Classification Search
CPC ..... H01Q 1/3233; H01Q 1/2283; H01Q 13/20
See application file for complete search history.

(56) References Cited

U.S. PATENT DOCUMENTS

| | | | |
|---|---|---|---|
| 5,912,598 A | 6/1999 | Stones et al. | |
| 6,958,662 B1 | 10/2005 | Salmela et al. | |
| 7,276,987 B2 | 10/2007 | Koriyama | |
| 7,289,069 B2 | 10/2007 | Ranta | |
| 9,202,162 B2 | 12/2015 | Gordon et al. | |
| 9,219,041 B2 | 12/2015 | Elad et al. | |
| 9,272,370 B2 | 3/2016 | Finn et al. | |
| 9,356,352 B2 | 5/2016 | Seok et al. | |
| 9,548,255 B1 | 1/2017 | Ge et al. | |
| 9,743,885 B1 | 8/2017 | Hao et al. | |
| 10,103,447 B2 * | 10/2018 | Tong | H01L 31/0203 |
| 2002/0114143 A1 | 8/2002 | Morrison et al. | |
| 2011/0180917 A1 | 7/2011 | Tang | |
| 2013/0062419 A1 | 3/2013 | Finn et al. | |

(Continued)

OTHER PUBLICATIONS

U.S. Appl. No. 16/287,226, filed Feb. 27, 2019, entitled "Package Integrated Waveguide".

(Continued)

*Primary Examiner* — Graham P Smith

(57) ABSTRACT

A method of manufacturing a packaged semiconductor device is provided. The method includes attaching a semiconductor die to a package substrate. A bond pad of the semiconductor die is coupled to an antenna radiator formed on the package substrate. A waveguide is attached to the package substrate. An opening of the waveguide includes sidewalls substantially surrounding the antenna radiator. An epoxy material is deposited over at least a portion of the package substrate while leaving the opening void of epoxy material.

20 Claims, 12 Drawing Sheets

(56) References Cited

U.S. PATENT DOCUMENTS

2019/0288371 A1    9/2019   Kamgaing et al.
2019/0372229 A1   12/2019   Dalmia et al.
2021/0021046 A1    1/2021   Rashid et al.

OTHER PUBLICATIONS

U.S. Appl. No. 16/524,596, filed Jul. 29, 2019, entitled "Method, System, and Apparatus for Forming Three-Dimensional Semiconductor Device Package With Waveguide".
Notice of Allowance dated Apr. 1, 2020 in U.S. Appl. No. 16/287,226.
Non-final office action dated Apr. 29, 2021 in U.S. Appl. No. 16/524,596.

* cited by examiner

PACKAGE INTEGRATED WAVEGUIDE

BACKGROUND

Field

This disclosure relates generally to semiconductor device packaging, and more specifically, to a semiconductor device having a package integrated waveguide.

Related Art

Today, there is an increasing trend to include radar systems in vehicles such as automobiles, trucks, buses, and the like in order to provide a driver with enhanced awareness of objects around the driver's vehicle. As the vehicle approaches objects (e.g. other cars, pedestrians, and obstacles) or as objects approach the vehicle, a driver cannot always detect the object and perform intervention actions needed to avoid a collision with the object. An automotive radar system mounted on a vehicle can detect the presence of objects including other vehicles in proximity to the vehicle and provide the driver with timely information so that the driver can perform possible intervention actions. However, such automotive radar system can significantly impact the cost of the vehicle.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a packaged semiconductor device with integrated waveguide. A semiconductor die and pre-formed waveguide are attached to a pre-formed package substrate. The semiconductor die is attached to the package substrate in a flip-chip arrangement. An antenna radiator is exposed in an air cavity formed in the waveguide allowing for efficient propagation (e.g., transmit and/or receive) of radar (e.g., wwWave) signals. By integrating the waveguide into/onto the package, required application circuit board space is minimized and overall costs are significantly reduced.

Figure 1:
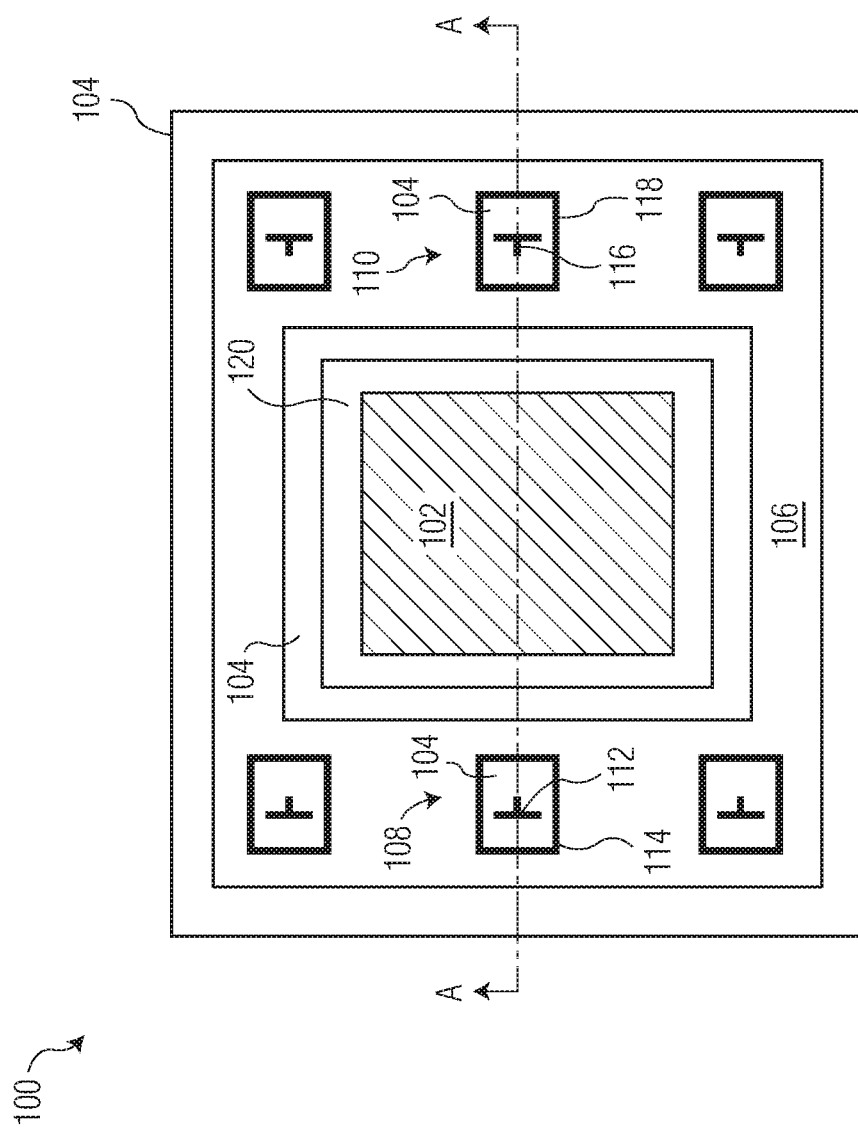
FIG. 1 illustrates, in a plan view, an example packaged semiconductor device with integrated waveguide at a stage of manufacture in accordance with an embodiment.

FIG. 1 illustrates, in a plan view, an example packaged semiconductor device 100 including integrated waveguides at a stage of manufacture in accordance with an embodiment. In this example, the packaged semiconductor device 100 may be characterized as a signal processing transceiver device where a first antenna group is used for transmitting a signal and a second antenna group is used for receiving a signal. Packaged semiconductor device 100 includes semiconductor die 102, package substrate 104, waveguide substrate 106, waveguides (e.g., 108-110), antenna radiators (e.g., 112, 116), conductive sidewalls (e.g., 114, 118) of waveguides, and epoxy underfill 120. Here, semiconductor die 102 is shown affixed to package substrate 104 and underfilled with epoxy 120. Waveguides (e.g., 108-110) are shown affixed to package substrate 104. Cross-sectional views of packaged semiconductor device 100 taken along line A-A including waveguides 108-110 are shown in example embodiments depicted in FIG. 2 and FIG. 3.

Figure 2:
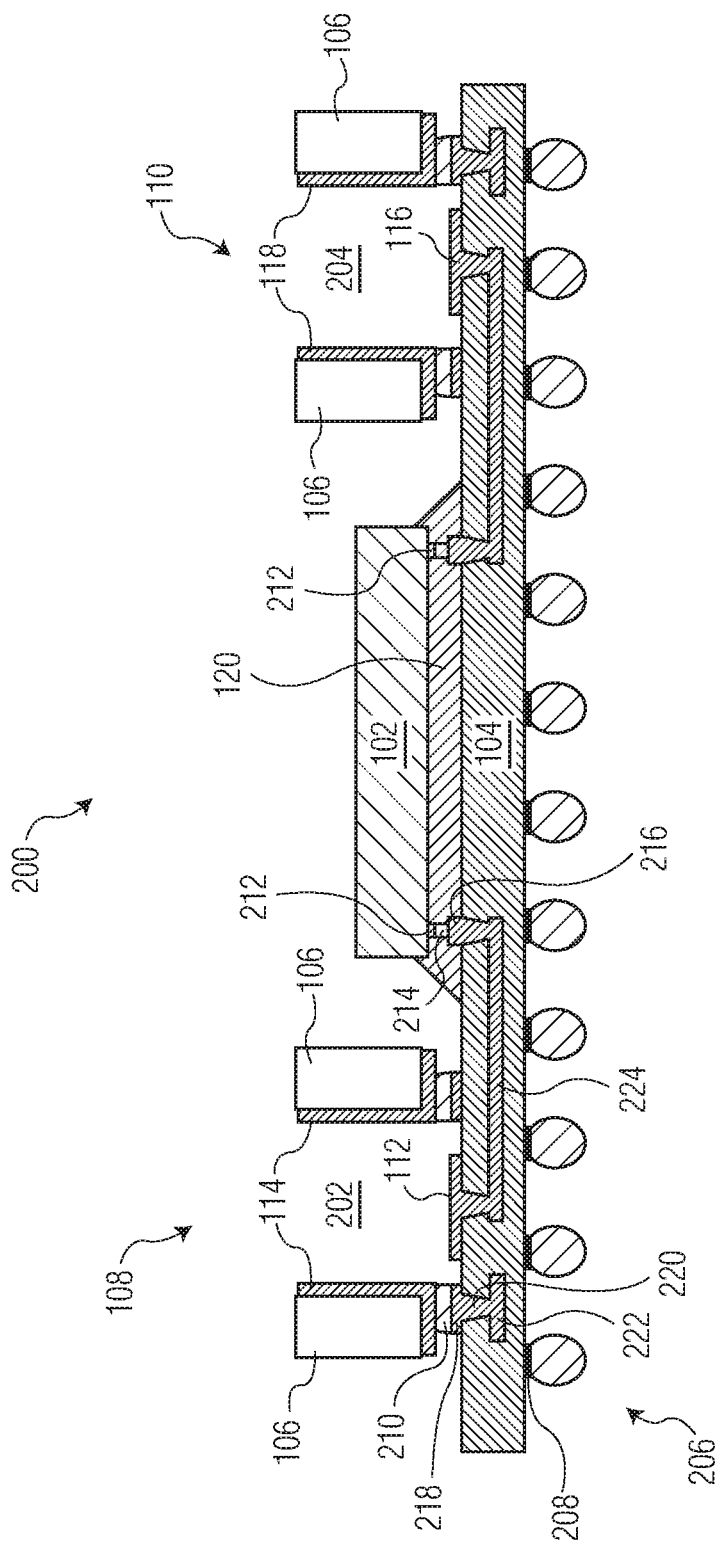
FIGS. 2-3 illustrate, in a simplified cross-sectional view, the example packaged semiconductor device of FIG. 1 along line A-A at stages of manufacture in accordance with an embodiment.

FIG. 2 illustrates, in a simplified cross-sectional view, an example packaged semiconductor device 200 taken along line A-A of FIG. 1 at a stage of manufacture in accordance with an embodiment. At this stage of manufacture, packaged semiconductor device 200 includes semiconductor die 102, waveguides 108-110, and conductive ball connectors 206 (e.g., solder balls) affixed to package substrate 104. Ball connectors 206 are affixed at ball terminal pads 208 using known techniques and materials. Alternatively, ball connectors 206 may be any suitable conductive structure such as gold studs, copper pillars, and the like, to electrically connect conductive features of packaged semiconductor device 200 with a printed circuit board, for example.

The semiconductor die 102 has an active surface (e.g., major surface having circuitry) and a backside surface (e.g., major surface opposite of the active surface). The semiconductor die 102 includes bond pads 212 at the active surface configured for connection to antenna radiators 112 and 116 by way of package substrate 104. In this embodiment, conductive pillars (e.g., copper pillars, nanotubes, solder bumps) 214 are employed to connect bond pads 212 to respective bond terminal pads 216 on package substrate 104. In some embodiments, a reflowable material (e.g., solder) may cover at least a portion of the conductive pillars 214 to facilitate electrical connection to the package substrate 104. The semiconductor die 102 may be formed from any suitable semiconductor material, such as silicon, germanium, gallium arsenide, gallium nitride and the like. Semiconductor die 102 may further include any digital circuits, analog circuits, RF circuits, memory, signal processor, MEMS, sensors, the like, and combinations thereof.

Package substrate 104 is a pre-formed substrate including a redistribution layer. The package substrate 104 is formed from an insulating material and includes conductive bond terminal pads 216-218 and antenna radiators 112 and 116 located on a first major surface and ball terminal pads 208 located on a second major surface. Conductive traces (e.g., 222-224) and vias (e.g., 220) interconnect bond terminal pads 216-218, antenna radiators 112 and 116, and ball terminal pads 208. Antenna radiators 112 and 116 formed at the first major surface of package substrate 104 are electrically connected to bond pads 212 at the active surface of semiconductor die by way of interconnect (e.g., redistribution layer) of package substrate 104. For example, antenna radiator 112 is electrically connected to a bond pad (e.g., 212) by way of interconnect 224 and corresponding conductive pillars 214 and bond terminal pads 216.

In this embodiment, waveguides 108-110 are pre-formed and attached to package substrate 104 at bond terminal pads 218 by way of conductive connectors 210 (e.g., solder, electrically conductive adhesive (ECA), anisotropic conductive film (ACF)). Waveguides 108-110 includes air cavities 202-204 formed in the waveguide substrate 106 allowing antenna radiators 112 and 116 to be exposed. Waveguides 108-110 dimensions (e.g., width, length) may be configured for propagation of signals (e.g., radar signals 76-81 GHz) having desired wavelengths. For example, waveguide 108 may be configured for propagation (e.g., transmission) of a radar signal having a frequency of 77 GHz. Because a 77 GHz signal has a wavelength of approximately 4 mm, the waveguide 108 is configured having a width dimension of approximately 2 mm, or half of the desired wavelength.

The waveguide substrate 106 may be formed from a non-conductive material. A conductive (e.g., metal or other conductive material) layer is formed on sidewalls 114 of air cavity 202 and sidewalls 118 of air cavity 204. The conductive layer formed on sidewalls 114 and 118 is coupled to a supply terminal (e.g., ground) at bond terminal pads 218 of the package substrate 104. In other embodiments, the conductive layer formed on sidewalls 114 and 118 may be coupled to other supply terminals (e.g., operating voltage supply) of the package substrate 104. A deposition process is employed to sputter deposit the conductive layer or coating on the sidewalls 114 and 118. In other embodiments, other techniques may be employed to form a conductive coating or layer on sidewalls 114 and 118 of cavities 202-204.

In an alternative embodiment, the waveguide substrate 106 may be formed from a conductive material such as a metal (e.g., aluminum) or other conductive material. The conductive waveguide substrate 106 is coupled to a supply terminal (e.g., ground) of the package substrate 104. In other embodiments, the conductive layer formed on sidewalls 114 and 118 may be coupled to other supply terminals (e.g., operating voltage supply) of the package substrate 104.

In the embodiment depicted in FIG. 2, semiconductor die 102 and waveguides 108-110 are attached to package substrate 104 before a gap between the active surface of semiconductor die 102 and package substrate 104 is underfilled with epoxy 120. The gap between the active surface of semiconductor die 102 and the package substrate 104 is generally formed as a result of flip-chip die attachment. Underfilling the gap provides a buffer to minimize stress by substantially encapsulating the active surface of semiconductor die 102 and a portion of the package substrate 104.

Figure 3:
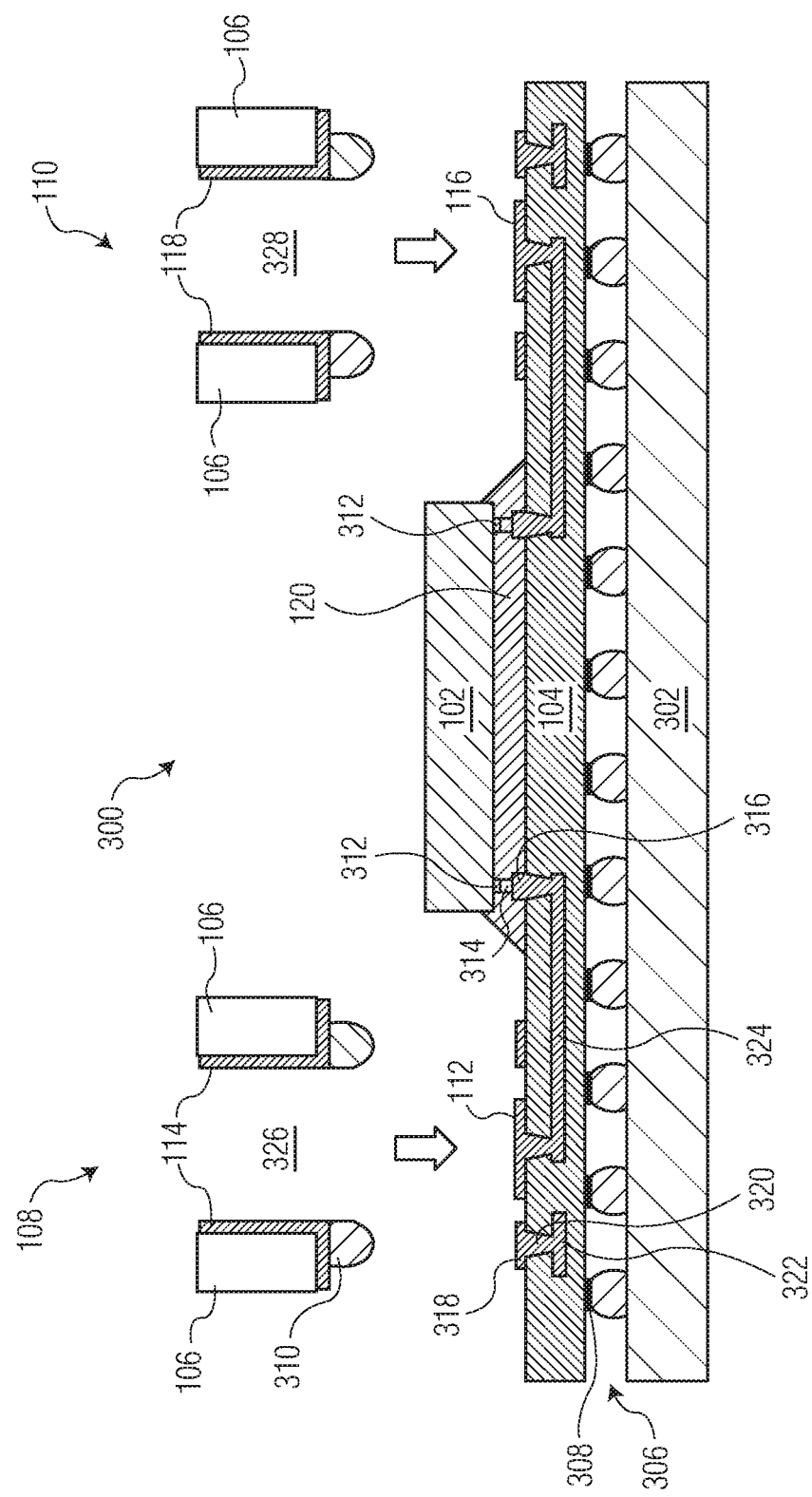

FIG. 3 illustrates, in a simplified cross-sectional view, another example packaged semiconductor device 300 taken along line A-A of FIG. 1 at a stage of manufacture in accordance with an alternative embodiment. At this stage of manufacture, packaged semiconductor device 300 includes waveguides 108-110 positioned over package substrate 104 having attached semiconductor die 102 and conductive ball connectors 306 (e.g., solder balls). Waveguides 108-110 are attached to package substrate 104 a gap formed between the semiconductor die 102 and the package substrate 104 is underfilled with an epoxy material. Ball connectors 306 are affixed at ball terminal pads 308 using known techniques and materials. Alternatively, ball connectors 306 may be any suitable conductive structure such as gold studs, copper pillars, and the like, to electrically connect conductive features of packaged semiconductor device 300 with a printed circuit board, for example.

The semiconductor die 102 has an active surface (e.g., major surface having circuitry) and a backside surface (e.g., major surface opposite of the active surface). The semiconductor die 102 includes bond pads 312 at the active surface configured for connection to antenna radiators 112 and 116 by way of package substrate 104. In this embodiment, conductive pillars (e.g., copper pillars, nanotubes, solder bumps) 314 are employed to connect bond pads 312 to respective bond terminal pads 316 on package substrate 104. In some embodiments, a reflowable material (e.g., solder) may cover at least a portion of the conductive pillars 314 to facilitate electrical connection to the package substrate 104. The semiconductor die 102 may be formed from any suitable semiconductor material, such as silicon, germanium, gallium arsenide, gallium nitride and the like. Semiconductor die 102 may further include any digital circuits, analog circuits, RF circuits, memory, signal processor, MEMS, sensors, the like, and combinations thereof.

Package substrate 104 is a pre-formed substrate including a redistribution layer. The package substrate 104 is formed from an insulating material and includes conductive bond terminal pads 316-318 and antenna radiators 112 and 116 located on a first major surface and ball terminal pads 308 located on a second major surface. Conductive traces (e.g., 322-324) and vias (e.g., 320) interconnect bond terminal pads 316-318, antenna radiators 112 and 116, and ball terminal pads 308. Antenna radiators 112 and 116 formed at the first major surface of package substrate 104 are electrically connected to bond pads 312 at the active surface of semiconductor die by way of interconnect (e.g., redistribution layer) of package substrate 104. For example, antenna radiator 112 is electrically connected to a bond pad (e.g., 312) by way of interconnect 324 and corresponding conductive pillars 314 and bond terminal pads 316.

In this embodiment, waveguides 108-110 are pre-formed and attached to package substrate 104 subsequent to underfilling the gap formed between the semiconductor die 102 and the package substrate 104 with an epoxy material. The waveguides 108-110 are at bond terminal pads 318 by way of conductive connectors 310 (e.g., solder, electrically conductive adhesive (ECA), anisotropic conductive film (ACF)). Waveguides 108-110 includes air cavities 326-328 formed in the waveguide substrate 106 allowing antenna radiators 112 and 116 to be exposed. Waveguides 108-110 dimensions (e.g., width, length) may be configured for propagation of signals (e.g., radar signals 76-81 GHz) having desired wavelengths. For example, waveguide 108 may be configured for propagation (e.g., transmission) of a radar signal having a frequency of 77 GHz. Because a 77 GHz signal has a wavelength of approximately 4 mm, the waveguide 108 is configured having a width dimension of approximately 2 mm, or half of the desired wavelength.

The waveguide substrate 106 may be formed from a non-conductive material. A conductive (e.g., metal or other conductive material) layer is formed on sidewalls 114 of air cavity 326 and sidewalls 118 of air cavity 328. The conductive layer formed on sidewalls 114 and 118 is coupled to a supply terminal (e.g., ground) at bond terminal pads 318 of the package substrate 104. In other embodiments, the conductive layer formed on sidewalls 114 and 118 may be coupled to other supply terminals (e.g., operating voltage supply) of the package substrate 104. A deposition process is employed to sputter deposit the conductive layer or coating on the sidewalls 114 and 118. In other embodiments, other techniques may be employed to form a conductive coating or layer on sidewalls 114 and 118 of cavities 326-328.

In an alternative embodiment, the waveguide substrate 106 may be formed from a conductive material such as a metal (e.g., aluminum) or other conductive material. The conductive waveguide substrate 106 is coupled to a supply terminal (e.g., ground) of the package substrate 104. In other embodiments, the conductive layer formed on sidewalls 114 and 118 may be coupled to other supply terminals (e.g., operating voltage supply) of the package substrate 104.

In the embodiment depicted in FIG. 3, waveguides 108-110 are attached to package substrate 104 subsequent to underfilling the gap between the active surface of semiconductor die 102 and package substrate 104. The gap between the active surface of semiconductor die 102 and the package substrate 104 is generally formed as a result of flip-chip die attachment. Underfilling the gap provides a buffer to minimize stress by substantially encapsulating the active surface of semiconductor die 102 and a portion of the package substrate 104.

Figure 4:
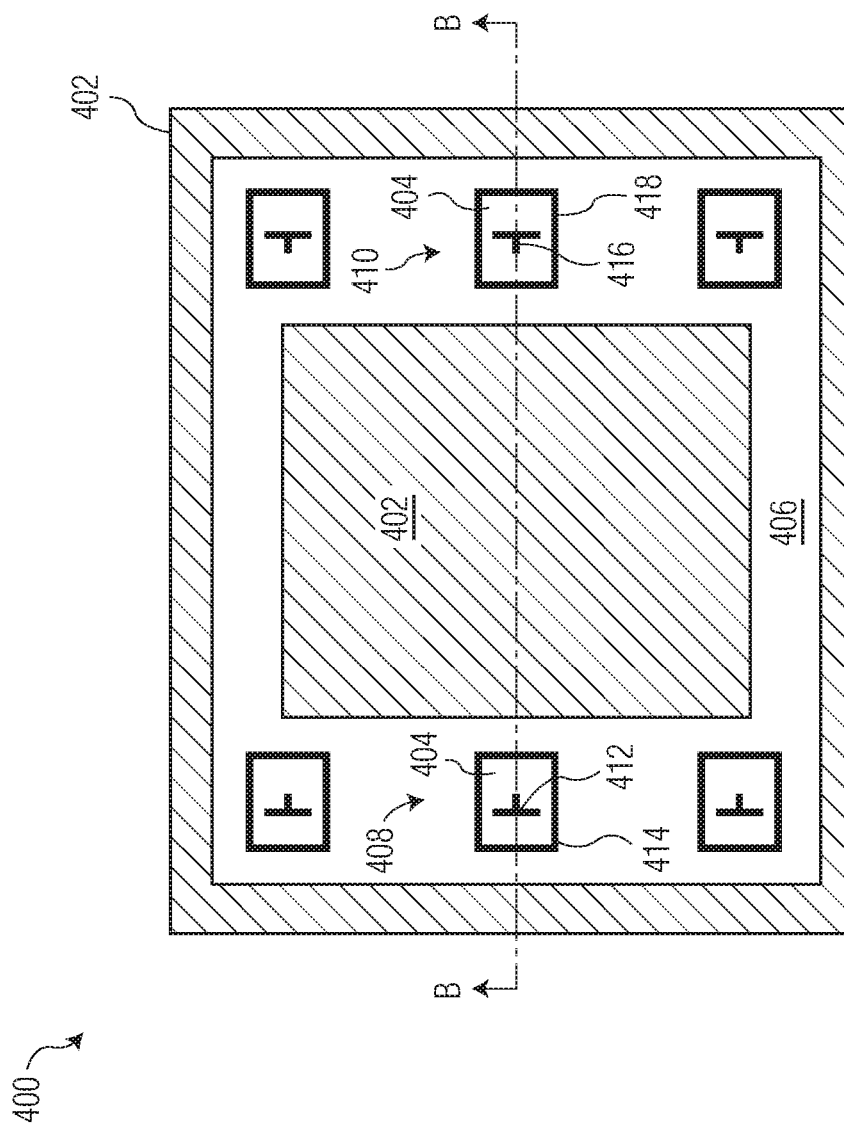
FIG. 4 illustrates, in a plan view, another example packaged semiconductor device with integrated waveguide at a stage of manufacture in accordance with an embodiment.

FIG. 4 illustrates, in a plan view, another example packaged semiconductor device 400 including integrated waveguides at a stage of manufacture in accordance with an embodiment. In this example, the packaged semiconductor device 400 may be characterized as a signal processing transceiver device where a first antenna group is used for transmitting a signal and a second antenna group is used for receiving a signal. Packaged semiconductor device 400 includes semiconductor die (not shown), epoxy encapsulant 402, package substrate 404, waveguide substrate 406, waveguides (e.g., 408-410), antenna radiators (e.g., 412, 416), and conductive sidewalls (e.g., 414, 418) of waveguides. Cross-sectional views of packaged semiconductor device 400 taken along line B-B including waveguides 408-410 are shown in example embodiments depicted in FIGS. 5-9.

Figure 5:
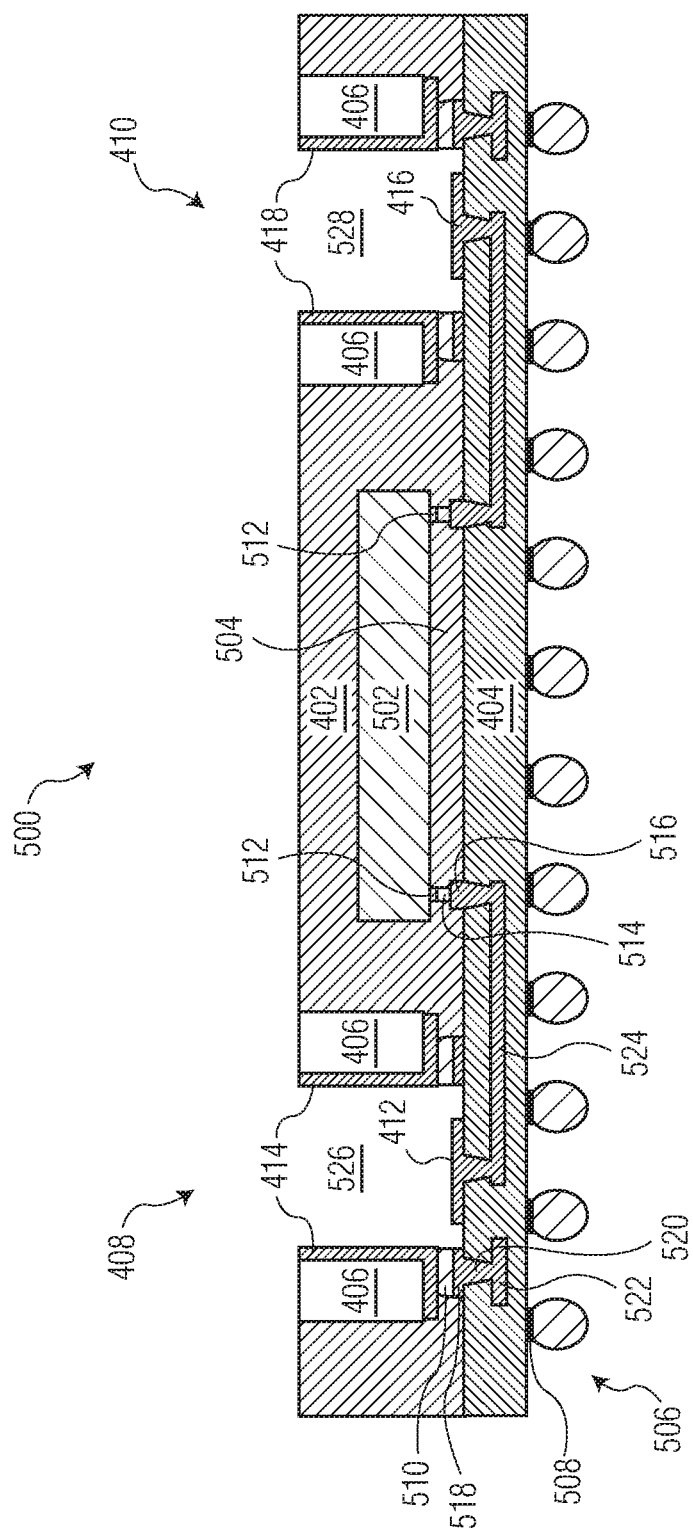
FIGS. 5-9 illustrate, in a simplified cross-sectional view, the example packaged semiconductor device of FIG. 4 along line B-B at stages of manufacture in accordance with an embodiment.

FIG. 5 illustrates, in a simplified cross-sectional view, an example packaged semiconductor device 500 taken along line B-B of FIG. 4 at a stage of manufacture in accordance with an embodiment. At this stage of manufacture, packaged semiconductor device 500 includes semiconductor die 502, waveguides 408-410, and conductive ball connectors 506 (e.g., solder balls) affixed to package substrate 404. Ball connectors 506 are affixed at ball terminal pads 508 using known techniques and materials. Alternatively, ball connectors 506 may be any suitable conductive structure such as gold studs, copper pillars, and the like, to electrically connect conductive features of packaged semiconductor device 500 with a printed circuit board, for example.

The semiconductor die 502 has an active surface (e.g., major surface having circuitry) and a backside surface (e.g., major surface opposite of the active surface). The semiconductor die 502 includes bond pads 512 at the active surface configured for connection to antenna radiators 412 and 416 by way of package substrate 404. In this embodiment, conductive pillars (e.g., copper pillars, nanotubes, solder bumps) 514 are employed to connect bond pads 512 to respective bond terminal pads 516 on package substrate 404. In some embodiments, a reflowable material (e.g., solder) may cover at least a portion of the conductive pillars 514 to facilitate electrical connection to the package substrate 404. The semiconductor die 502 may be formed from any suitable semiconductor material, such as silicon, germanium, gallium arsenide, gallium nitride and the like. Semiconductor die 502 may further include any digital circuits, analog circuits, RF circuits, memory, signal processor, MEMS, sensors, the like, and combinations thereof.

Package substrate 404 is a pre-formed substrate including a redistribution layer. The package substrate 404 is formed from an insulating material and includes conductive bond terminal pads 516-518 and antenna radiators 412 and 416 located on a first major surface and ball terminal pads 508 located on a second major surface. Conductive traces (e.g., 522-524) and vias (e.g., 520) interconnect bond terminal pads 516-518, antenna radiators 412 and 416, and ball terminal pads 508. Antenna radiators 412 and 416 formed at the first major surface of package substrate 404 are electrically connected to bond pads 512 at the active surface of semiconductor die by way of interconnect (e.g., redistribution layer) of package substrate 404. For example, antenna radiator 412 is electrically connected to a bond pad (e.g., 512) by way of interconnect 524 and corresponding conductive pillars 514 and bond terminal pads 516.

In this embodiment, waveguides 408-410 are pre-formed and attached to package substrate 404 at bond terminal pads 518 by way of conductive connectors 510 (e.g., solder, ECA, ACF). Waveguides 408-410 includes air cavities 526-528 formed in the waveguide substrate 406 allowing antenna radiators 412 and 416 to be exposed. Waveguides 408-410 dimensions (e.g., width, length) may be configured for propagation of signals (e.g., radar signals 76-81 GHz) having desired wavelengths. For example, waveguide 408 may be configured for propagation (e.g., transmission) of a radar signal having a frequency of 77 GHz. Because a 77 GHz signal has a wavelength of approximately 4 mm, the waveguide 408 is configured having a width dimension of approximately 2 mm, or half of the desired wavelength.

The waveguide substrate 406 may be formed from a non-conductive material (e.g., ceramic, FR-4). A conductive (e.g., metal or other conductive material) layer is formed on sidewalls 414 of air cavity 526 and sidewalls 418 of air cavity 528. The conductive layer formed on sidewalls 414 and 418 is coupled to a supply terminal (e.g., ground) at bond terminal pads 518 of the package substrate 404. In other embodiments, the conductive layer formed on sidewalls 414 and 418 may be coupled to other supply terminals (e.g., operating voltage supply) of the package substrate 404. A deposition process is employed to sputter deposit the conductive layer or coating on the sidewalls 414 and 418. In other embodiments, other techniques may be employed to form a conductive coating or layer on sidewalls 414 and 418 of cavities 526-528.

In an alternative embodiment, the waveguide substrate 406 may be formed from a conductive material such as a metal (e.g., aluminum) or other conductive material. The conductive waveguide substrate 406 is coupled to a supply terminal (e.g., ground) of the package substrate 404. In other embodiments, the conductive waveguide substrate 406 may be coupled to other supply terminals (e.g., operating voltage supply) of the package substrate 404.

In the embodiment depicted in FIG. 5, semiconductor die 502 and waveguides 408-410 are attached to package substrate 404 before semiconductor die 502 and a portion of package substrate 404 are at least partially encapsulated with an epoxy material encapsulant. In this embodiment, the epoxy material is depositing over the semiconductor die 502 and package substrate 404 using an injection molding process characterized as over-molding. After the semiconductor die 502 and the package substrate 404 are over-molded with the encapsulant, the air cavities 526-528 remain substantially void of the encapsulant. In an alternative embodiment, a gap between the active surface of semiconductor die 502 and package substrate 404 may be underfilled with an epoxy material before the semiconductor die 502 and the package substrate 404 are over-molded with the encapsulant.

Figure 6:
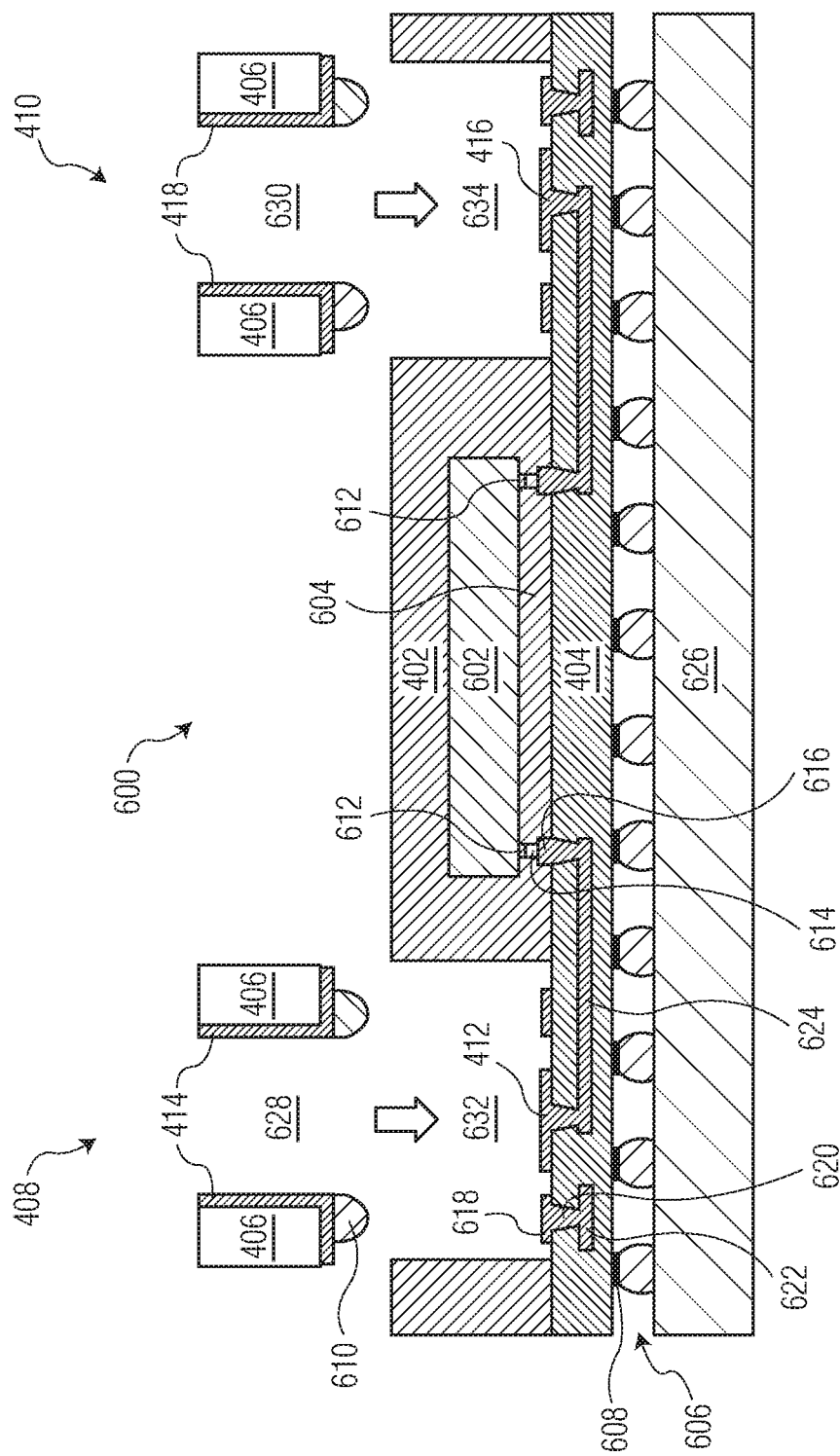

FIG. 6 illustrates, in a simplified cross-sectional view, another example packaged semiconductor device 600 taken along line B-B of FIG. 4 at a stage of manufacture in accordance with an embodiment. At this stage of manufacture, packaged semiconductor device 600 includes waveguides 408-410 positioned over the partially encapsulated semiconductor die 502 and package substrate 404. Waveguides 408-410 are attached to package substrate 404 at cavities 632-634 formed in encapsulant 402 exposing antenna radiators 412 and 416. In this embodiment, conductive ball connectors 606 (e.g., solder balls) are affixed at ball terminal pads 608 and printed circuit board 626 using known techniques and materials. Alternatively, ball connectors 606 may be any suitable conductive structure such as gold studs, copper pillars, and the like, to electrically connect conductive features of packaged semiconductor device 600 with the printed circuit board 626, for example.

The semiconductor die 602 has an active surface (e.g., major surface having circuitry) and a backside surface (e.g., major surface opposite of the active surface). The semiconductor die 602 includes bond pads 612 at the active surface configured for connection to antenna radiators 412 and 416 by way of package substrate 404. In this embodiment, conductive pillars (e.g., copper pillars, nanotubes, solder bumps) 614 are employed to connect bond pads 612 to respective bond terminal pads 616 on package substrate 404. In some embodiments, a reflowable material (e.g., solder) may cover at least a portion of the conductive pillars 614 to facilitate electrical connection to the package substrate 404. The semiconductor die 602 may be formed from any suitable semiconductor material, such as silicon, germanium, gallium arsenide, gallium nitride and the like. Semiconductor die 602 may further include any digital circuits, analog circuits, RF circuits, memory, signal processor, MEMS, sensors, the like, and combinations thereof.

Package substrate 404 is a pre-formed substrate including a redistribution layer. The package substrate 404 is formed from an insulating material and includes conductive bond terminal pads 616-618 and antenna radiators 412 and 416 located on a first major surface and ball terminal pads 608 located on a second major surface. Conductive traces (e.g., 622-624) and vias (e.g., 620) interconnect bond terminal pads 616-618, antenna radiators 412 and 416, and ball terminal pads 608. Antenna radiators 412 and 416 formed at the first major surface of package substrate 404 are electrically connected to bond pads 612 at the active surface of semiconductor die by way of interconnect (e.g., redistribution layer) of package substrate 404. For example, antenna radiator 412 is electrically connected to a bond pad (e.g., 612) by way of interconnect 624 and corresponding conductive pillars 614 and bond terminal pads 616.

In this embodiment, waveguides 408-410 are pre-formed and attached to package substrate 404 at bond terminal pads 618 by way of conductive connectors 610 (e.g., solder, ECA, ACF). Waveguides 408-410 includes air cavities 628-630 formed in the waveguide substrate 406 allowing antenna radiators 412 and 416 to be exposed after waveguides 408-410 are attached to package substrate 404. Waveguides 408-410 dimensions (e.g., width, length) may be configured for propagation of signals (e.g., radar signals 76-81 GHz) having desired wavelengths. For example, waveguide 408 may be configured for propagation (e.g., transmission) of a radar signal having a frequency of 77 GHz. Because a 77 GHz signal has a wavelength of approximately 4 mm, the waveguide 408 is configured having a width dimension of approximately 2 mm, or half of the desired wavelength.

The waveguide substrate 406 may be formed from a non-conductive material (e.g., ceramic, FR-4). A conductive (e.g., metal or other conductive material) layer is formed on sidewalls 414 of air cavity 526 and sidewalls 418 of air cavity 528. The conductive layer formed on sidewalls 414 and 418 is coupled to a supply terminal (e.g., ground) at bond terminal pads 618 of the package substrate 404. In other embodiments, the conductive layer formed on sidewalls 414 and 418 may be coupled to other supply terminals (e.g., operating voltage supply) of the package substrate 404. A deposition process is employed to sputter deposit the conductive layer or coating on the sidewalls 414 and 418. In other embodiments, other techniques may be employed to form a conductive coating or layer on sidewalls 414 and 418 of cavities 628-630.

In an alternative embodiment, the waveguide substrate 406 may be formed from a conductive material such as a metal (e.g., aluminum) or other conductive material. The conductive waveguide substrate 406 is coupled to a supply terminal (e.g., ground) at bond terminal pads 618 of the package substrate 404. In other embodiments, the conductive waveguide substrate 406 may be coupled to other supply terminals (e.g., operating voltage supply) of the package substrate 404.

In the embodiment depicted in FIG. 6, waveguides 408-410 are attached to package substrate 404 subsequent to encapsulating semiconductor die 602 and a portion of package substrate 404 with epoxy material encapsulant 402. In this embodiment, the epoxy material 402 is deposited over the semiconductor die 602 and package substrate 404 using an injection over-molding process characterized as film-assisted molding whereby a conformal film is contacted with surface areas of substrate 404 to form cavities 632-634. In other embodiments, cavities 632-634 may be formed by other suitable techniques such as laser drilling, dry etching, wet etching, or combinations thereof for example. In an alternative embodiment, a gap 604 between the active surface of semiconductor die 602 and package substrate 404 may be underfilled with an epoxy material before the semiconductor die 602 and the package substrate 404 are over-molded with the encapsulant.

Figure 7:
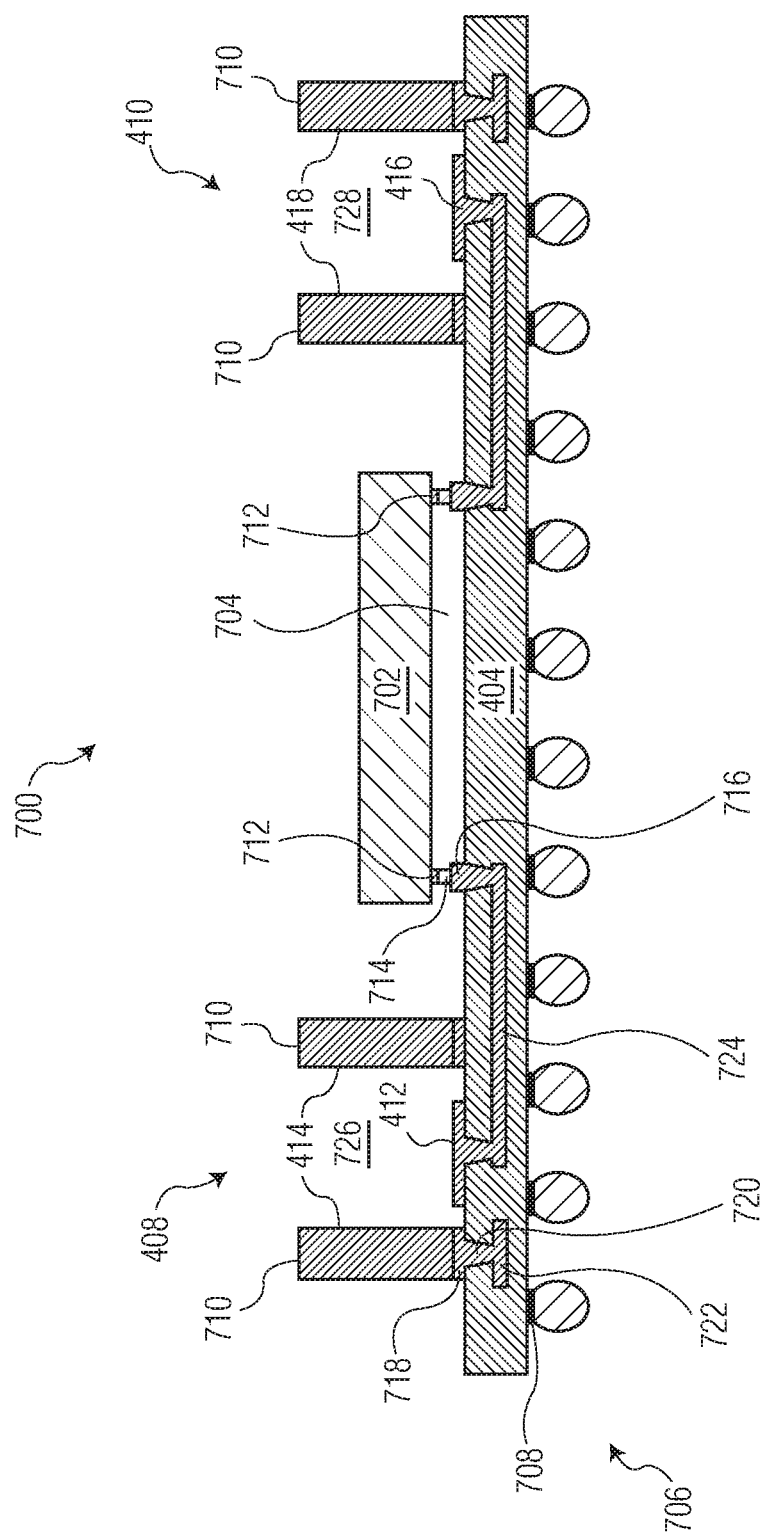

FIG. 7 illustrates, in a simplified cross-sectional view, an example packaged semiconductor device 700 taken along line B-B of FIG. 4 at a stage of manufacture in accordance with an embodiment. At this stage of manufacture, packaged semiconductor device 700 includes semiconductor die 702, waveguides 408-410, and conductive ball connectors 706 (e.g., solder balls) affixed to package substrate 404. Ball connectors 706 are affixed at ball terminal pads 708 using known techniques and materials. Alternatively, ball connectors 706 may be any suitable conductive structure such as gold studs, copper pillars, and the like, to electrically connect conductive features of packaged semiconductor device 700 with a printed circuit board, for example.

The semiconductor die 702 has an active surface (e.g., major surface having circuitry) and a backside surface (e.g., major surface opposite of the active surface). The semiconductor die 702 includes bond pads 712 at the active surface configured for connection to antenna radiators 412 and 416 by way of package substrate 404. In this embodiment, conductive pillars 714 (e.g., copper pillars, nanotubes, solder bumps) are employed to connect bond pads 712 to respective bond terminal pads 716 on package substrate 404. In some embodiments, a reflowable material (e.g., solder) may cover at least a portion of the conductive pillars 714 to facilitate electrical connection to the package substrate 404. The semiconductor die 702 may be formed from any suitable semiconductor material, such as silicon, germanium, gallium arsenide, gallium nitride and the like. Semiconductor die 702 may further include any digital circuits, analog circuits, RF circuits, memory, signal processor, MEMS, sensors, the like, and combinations thereof.

Package substrate 404 is a pre-formed substrate including a redistribution layer. The package substrate 404 is formed from an insulating material and includes conductive bond terminal pads 716-718 and antenna radiators 412 and 416 located on a first major surface and ball terminal pads 708 located on a second major surface. Conductive traces (e.g., 722-724) and vias (e.g., 720) interconnect bond terminal pads 716-718, antenna radiators 412 and 416, and ball terminal pads 708. Antenna radiators 412 and 416 formed at the first major surface of package substrate 404 are electrically connected to bond pads 712 at the active surface of semiconductor die by way of interconnect (e.g., redistribution layer) of package substrate 404. For example, antenna radiator 412 is electrically connected to a bond pad (e.g., 712) by way of interconnect 724 and corresponding conductive pillars 714 and bond terminal pads 716.

In this embodiment, waveguides 408-410 are formed on package substrate 404 at bond terminal pads 718. Waveguides 408-410 are formed by using a fence of conductive vias or pillars 710 as waveguide substrate portions surrounding air cavities 726-728. The conductive vias or pillars 710 essentially form conductive sidewalls 414 and 418 coupled to a supply terminal (e.g., ground) at bond terminal pads 718 of the package substrate 404. In other embodiments, the conductive sidewalls 414 and 418 may be coupled to other supply terminals (e.g., operating voltage supply) of the package substrate 404. Waveguides 408-410 dimensions (e.g., width, length) may be configured for propagation of signals (e.g., radar signals 76-81 GHz) having desired wavelengths. For example, waveguide 408 may be configured for propagation (e.g., transmission) of a radar signal having a frequency of 77 GHz. Because a 77 GHz signal has a wavelength of approximately 4 mm, the waveguide 408 is configured having a width dimension of approximately 2 mm, or half of the desired wavelength.

Figure 8:
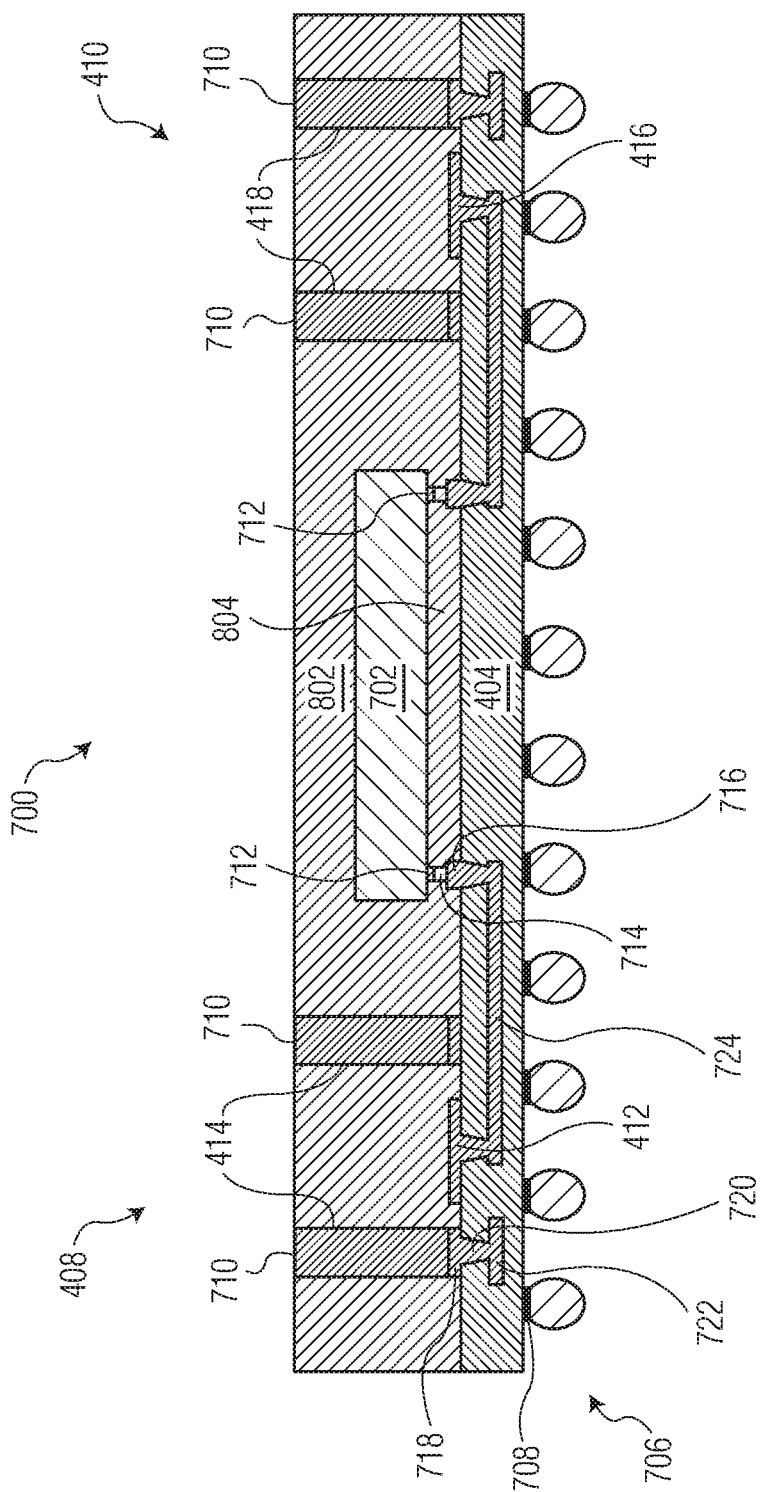

FIG. 8 illustrates, in a simplified cross-sectional view, example packaged semiconductor device 700 taken along line B-B of FIG. 4 at a subsequent stage of manufacture in accordance with an embodiment. At this stage of manufacture, packaged semiconductor device 700 includes semiconductor die 702, waveguides 408-410, and package substrate 404 encapsulated with an epoxy material encapsulant 802. In this embodiment, the epoxy material 802 is deposited over the semiconductor die 702, waveguides 408-410, and package substrate 404 using an injection molding process characterized as over-molding. In an alternative embodiment, a gap between the active surface of semiconductor die 702 and package substrate 404 may be underfilled with an epoxy material before the semiconductor die 702, waveguides 408-410, and the package substrate 404 are over-molded with the encapsulant.

Figure 9:
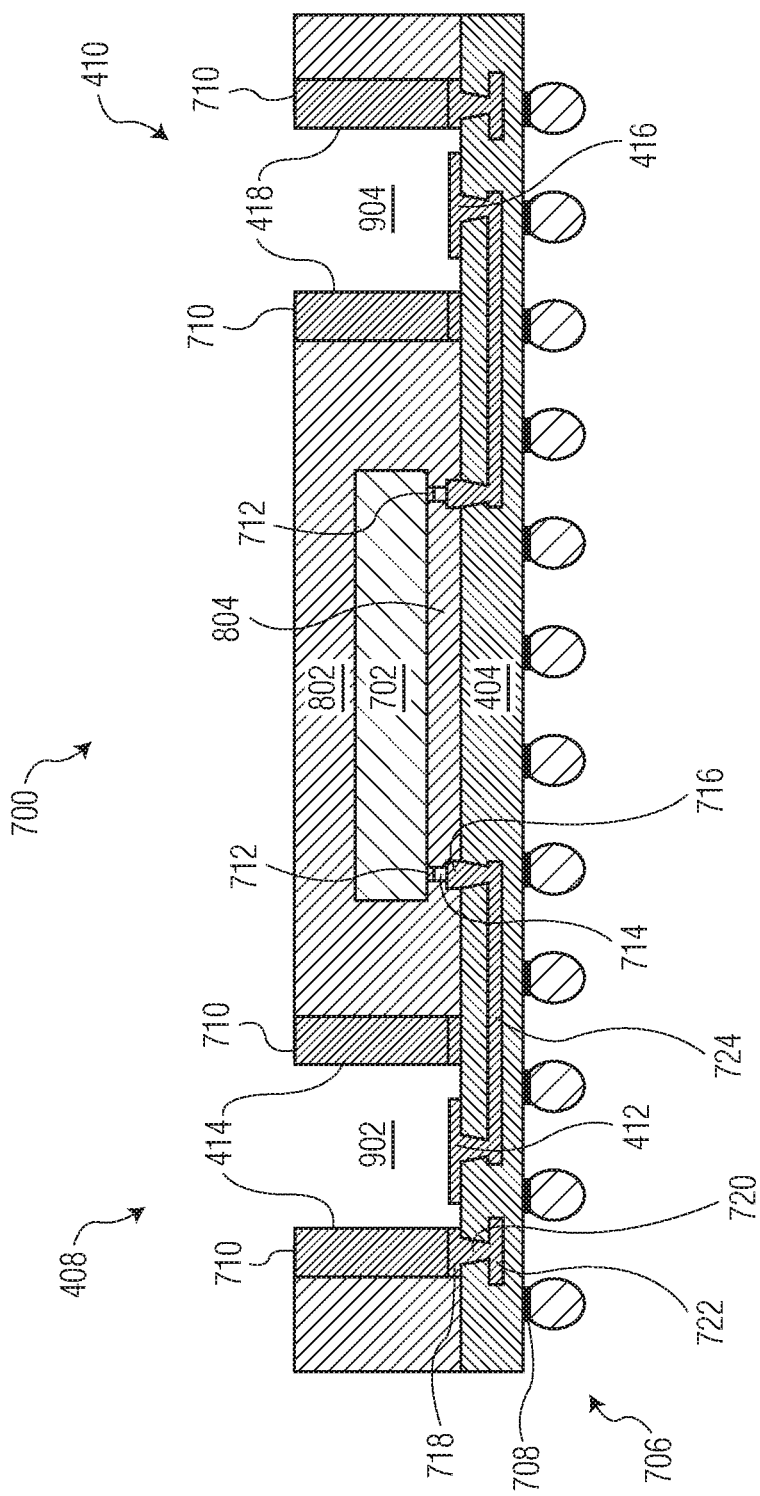

FIG. 9 illustrates, in a simplified cross-sectional view, example packaged semiconductor device 700 taken along line B-B of FIG. 4 at a subsequent stage of manufacture in accordance with an embodiment. At this stage of manufacture, packaged semiconductor device 700 includes air cavities 902-904 formed to expose antenna radiators 412 and 416 and sidewalls 414 and 418 of waveguides 408-410. In this embodiment, the epoxy material 802 is removed from regions encompassed by conductive vias or pillars 710 to form air cavities 902-904 using techniques such as laser drilling, dry etching, wet etching, or combinations thereof for example.

Figure 10:
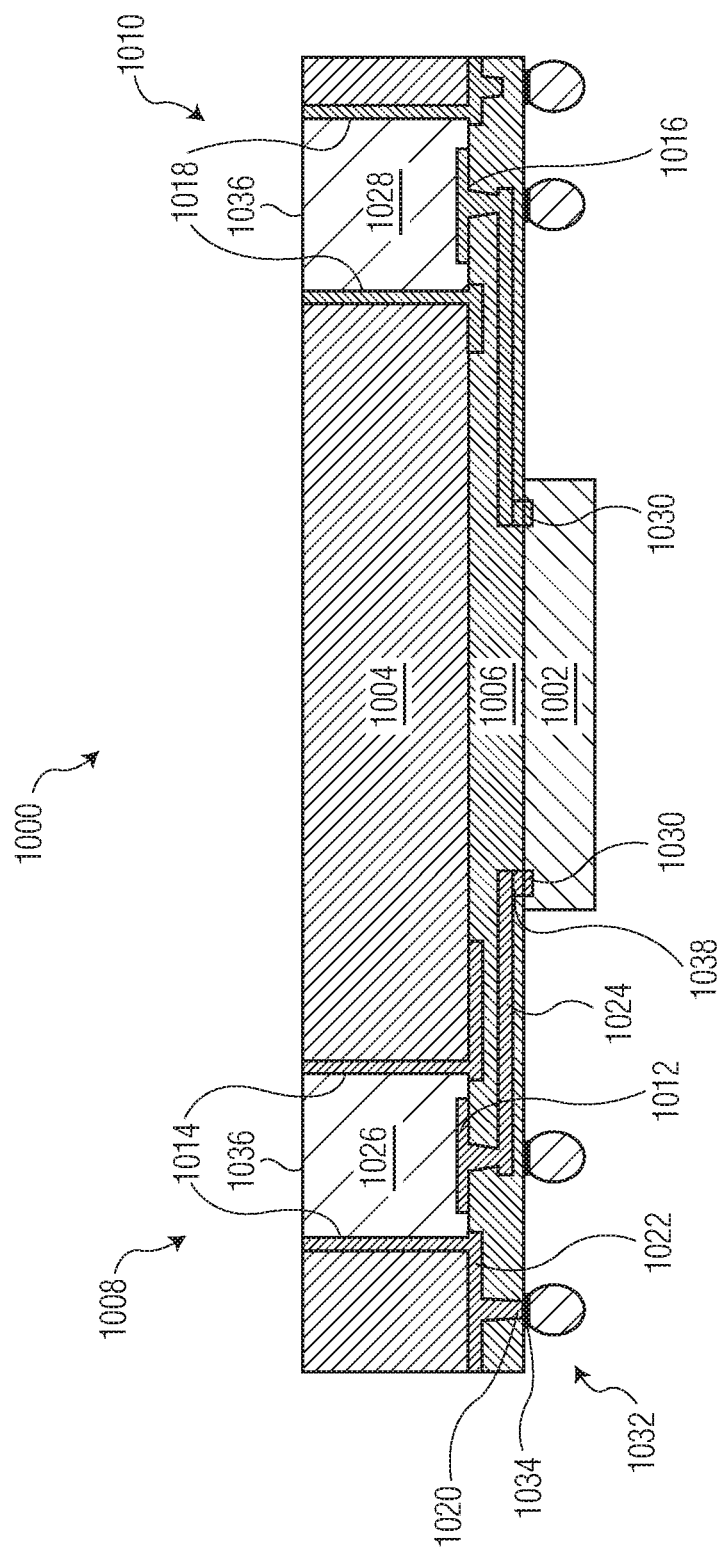
FIG. 10 illustrates, in a simplified cross-sectional view, another example packaged semiconductor device with integrated waveguide at a stage of manufacture in accordance with an embodiment.

FIG. 10 illustrates, in a simplified cross-sectional view, another example packaged semiconductor device 1000 with integrated waveguide at a stage of manufacture in accordance with an embodiment. At this stage of manufacture, packaged semiconductor device 1000 includes semiconductor die 1002 affixed to build-up substrate 1006 formed on package substrate 1004. Package substrate 1004 is configured with integrated waveguides 1008-1010. Ball connectors 1032 (e.g., solder balls) are affixed at ball terminal pads 1034 of build-up substrate 1006 using known techniques and materials. Alternatively, ball connectors 1032 may be any suitable conductive structure such as gold studs, copper pillars, and the like, to electrically connect conductive features of packaged semiconductor device 1000 with a printed circuit board, for example.

The semiconductor die 1002 has an active surface (e.g., major surface having circuitry) and a backside surface (e.g., major surface opposite of the active surface). The semiconductor die 1002 includes bond pads 1030 at the active surface configured for connection to antenna radiators 1012 and 1016 by way of build-up substrate 1006. The semiconductor die 1002 may be formed from any suitable semiconductor material, such as silicon, germanium, gallium arsenide, gallium nitride and the like. Semiconductor die 1002 may further include any digital circuits, analog circuits, RF circuits, memory, signal processor, MEMS, sensors, the like, and combinations thereof.

The package substrate 1004 is a pre-formed substrate including integrated waveguides 1008-1010. The package substrate 1004 may be formed from a non-conductive material (e.g., ceramic, FR-4). A conductive (e.g., metal or other conductive material) layer or coating is formed on sidewalls 1014 and 1018 of waveguides 1008-1010. A sacrificial material 1036 is disposed in cavities 1026-1028 to provide a substantially planar surface during the build-up process to form build-up substrate 1006. After the build-up substrate 1006 is formed, the sacrificial material 1036 is removed to expose antenna radiators 1012 and 1016 and sidewalls 1014 and 1018 in cavities 1026-1028 of waveguides 1008-1010. The sacrificial material 1036 may be removed by a laser removal process or chemically etched, for example. The conductive layer formed on sidewalls 1014 and 1018 is coupled to a supply terminal (e.g., ground) by way of the build-up substrate 1006. In other embodiments, the conductive layer formed on sidewalls 1014 and 1018 may be coupled to other supply terminals (e.g., operating voltage supply) of the build-up substrate 1006. A deposition process is employed to sputter deposit the conductive layer or coating on the sidewalls 1014 and 1018. In other embodiments, other techniques may be employed to form the conductive coating or layer on sidewalls 1014 and 1018. Waveguides 1008-1010 dimensions (e.g., width, length) may be configured for propagation of signals (e.g., radar signals 76-81 GHz) having desired wavelengths. For example, waveguide 1008 may be configured for propagation (e.g., transmission) of a radar signal having a frequency of 77 GHz. Because a 77 GHz signal has a wavelength of approximately 4 mm, the waveguide 1008 is configured having a width dimension of approximately 2 mm, or half of the desired wavelength.

The build-up substrate 1006 is formed by way of a build-up process in which insulating and conductive layers are patterned and successively built-up to form an interconnecting redistribution layer. The semiconductor die 1002 is interconnected to antenna radiators 1012 and 1016 by way of the build-up substrate 1006. The build-up substrate 1006 includes conductive bond terminal pads 1038 and ball terminal pads 1034 formed on a first major surface, and conductive traces 1022-1024 and vias 1020 interconnecting bond terminal pads 1038, antenna radiators 1012 and 1016, and ball terminal pads 1034. Bond terminal pads 1038 form electrical connections with bond pads 1030 of the semiconductor die 1002 and antennas radiators 1012 and 1016. Antenna radiators 1012 and 1016 formed at a second major surface of build-up substrate 1006 are electrically connected to bond pads 1030 at the active surface of semiconductor die 1002 by way of interconnect (e.g., redistribution layer) of build-up substrate 1006. For example, antenna radiator 1012 is electrically connected to a bond pad 1030 by way of interconnect 1024 and corresponding bond terminal pad 1038.

Figure 11:
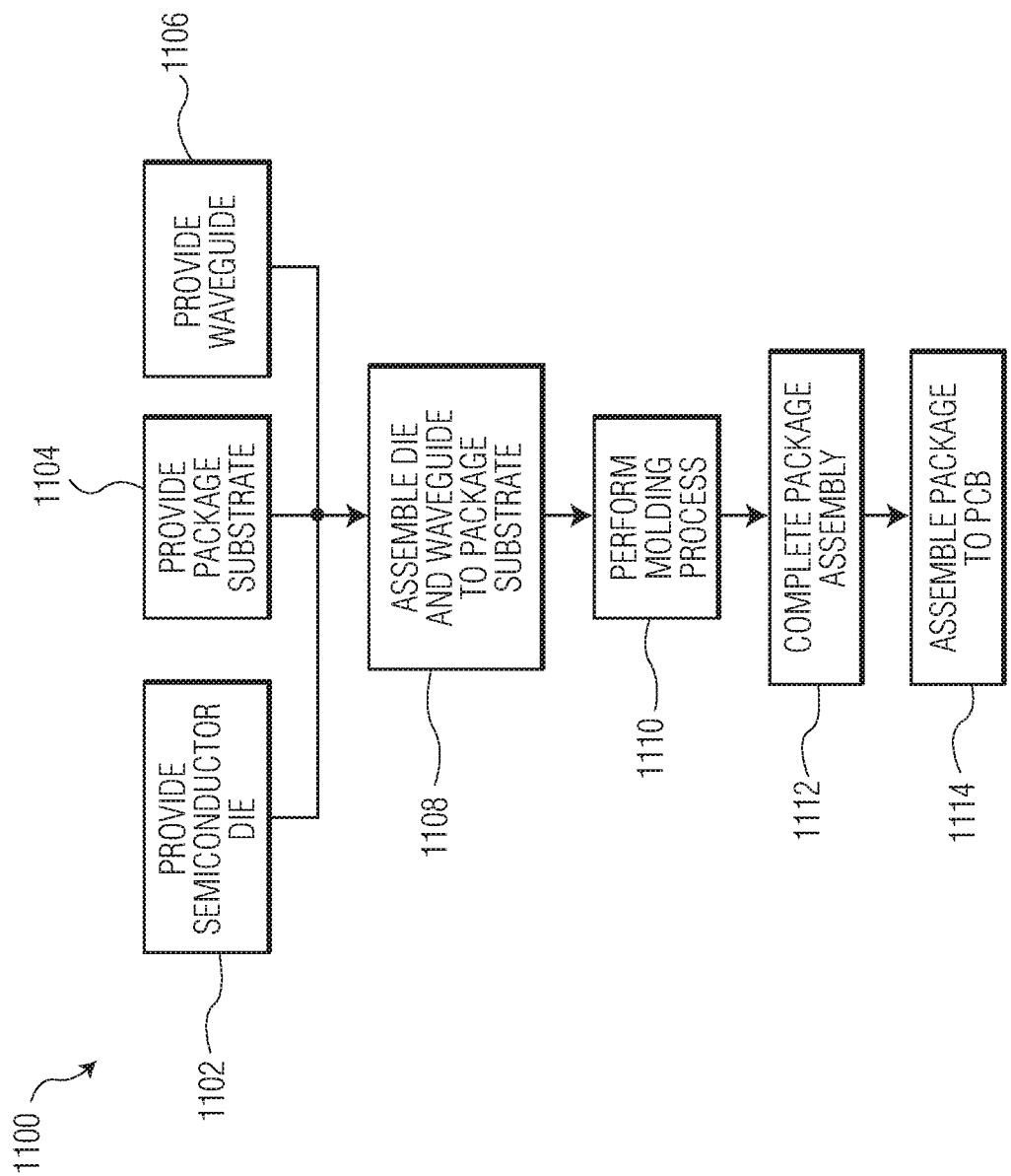
FIGS. 11-12 illustrate, in flow diagram form, example methods of forming a packaged semiconductor device with integrated waveguide in accordance with an embodiment.

FIG. 11 illustrates, in flow diagram form, an example method 1100 of forming a packaged semiconductor device with integrated waveguide in accordance with an embodiment. In this embodiment, the packaged semiconductor device includes a semiconductor die and a waveguide attached to a package substrate prior to being subjected to a molding process.

At step 1102, provide the semiconductor die. In this embodiment, the semiconductor die includes bond pads at an active surface configured for connection to antenna radiators by way of the package substrate. The semiconductor die may be formed from any suitable semiconductor material, such as silicon, germanium, gallium arsenide, gallium nitride and the like. Semiconductor die may further include any digital circuits, analog circuits, RF circuits, memory, signal processor, MEMS, sensors, the like, and combinations thereof.

At step 1104, provide the package substrate. In this embodiment, the package substrate is a pre-formed substrate including a redistribution layer (e.g., metal interconnect layer). In an alternative embodiment, the package substrate may be formed as a build-up substrate. In yet another embodiment, the package substrate may be configured to incorporate one or more waveguides. Antenna radiators and bond terminal pads are formed at a first major surface of the package substrate and ball terminal pads are formed at a second major surface of the package substrate. The antenna radiators are electrically connected to bond pads of the semiconductor die by way of the redistribution layer.

At step 1106, provide the waveguide. In this embodiment, the waveguide is pre-formed and in a subsequent step, attached to the package substrate. The waveguide is configured having an air cavity formed in a waveguide substrate to allow an antenna radiator to be exposed when assembled. Dimensions (e.g., width, length) of the waveguide air cavity may be configured for propagation of signals (e.g., radar signals 76-81 GHz) having desired wavelengths. The waveguide substrate may be formed from a non-conductive material (e.g., ceramic, FR-4). A conductive (e.g., metal or other conductive material) layer is formed on sidewalls of the air cavity. The conductive layer formed on sidewalls is coupled to a supply terminal (e.g., ground) at a subsequent step.

At step 1108, assemble semiconductor die and waveguide to the package substrate. In this embodiment, the semiconductor die is attached at a first portion of the package substrate in a flip-chip configuration and the waveguide is attached at a second portion of the package substrate. Conductive pillars (e.g., copper pillars, nanotubes, solder bumps) are used to connect bond pads of the semiconductor die to respective bond terminal pads on the package substrate. With the semiconductor die attached, a conductive path is formed between the antenna radiator and the semiconductor die. The waveguide is attached to the package substrate at bond terminal pads by way of conductive connectors (e.g., solder, ECA, ACF), and the conductive layer formed on sidewalls of the waveguide is coupled to a supply terminal of the package substrate.

At step 1110, perform the molding process. In this embodiment, a gap formed between the semiconductor die and the package substrate is underfilled. The underfill molding process includes a dispensed epoxy material which is drawn into the gap by way of capillary action. In an alternative embodiment, the semiconductor die and portions of the package substrate are over-molded with an epoxy material encapsulant, while keeping the air cavity clear of encapsulant. The over-molding process may utilize film-assisted molding (FAM) to keep the air cavity clear of encapsulant. In an embodiment, the over-molding process may occur after the underfill molding process.

At step 1112, complete package assembly. In this embodiment, conductive ball connectors (e.g., solder balls) are attached to the package substrate at ball terminal pads. The ball connectors are connected at ball terminal pads using known techniques and materials. Alternatively, ball connectors may be formed from any suitable conductive structure such as gold studs, copper pillars, and the like.

At step 1114, assemble package to a printed circuit board (PCB). In this embodiment, the packaged semiconductor device is attached to a printed circuit board, for example. Ball connectors affixed to the package substrate are attached to the PCB configured to form conductive paths between conductive features of the packaged semiconductor device and conductive features of the PCB.

Figure 12:
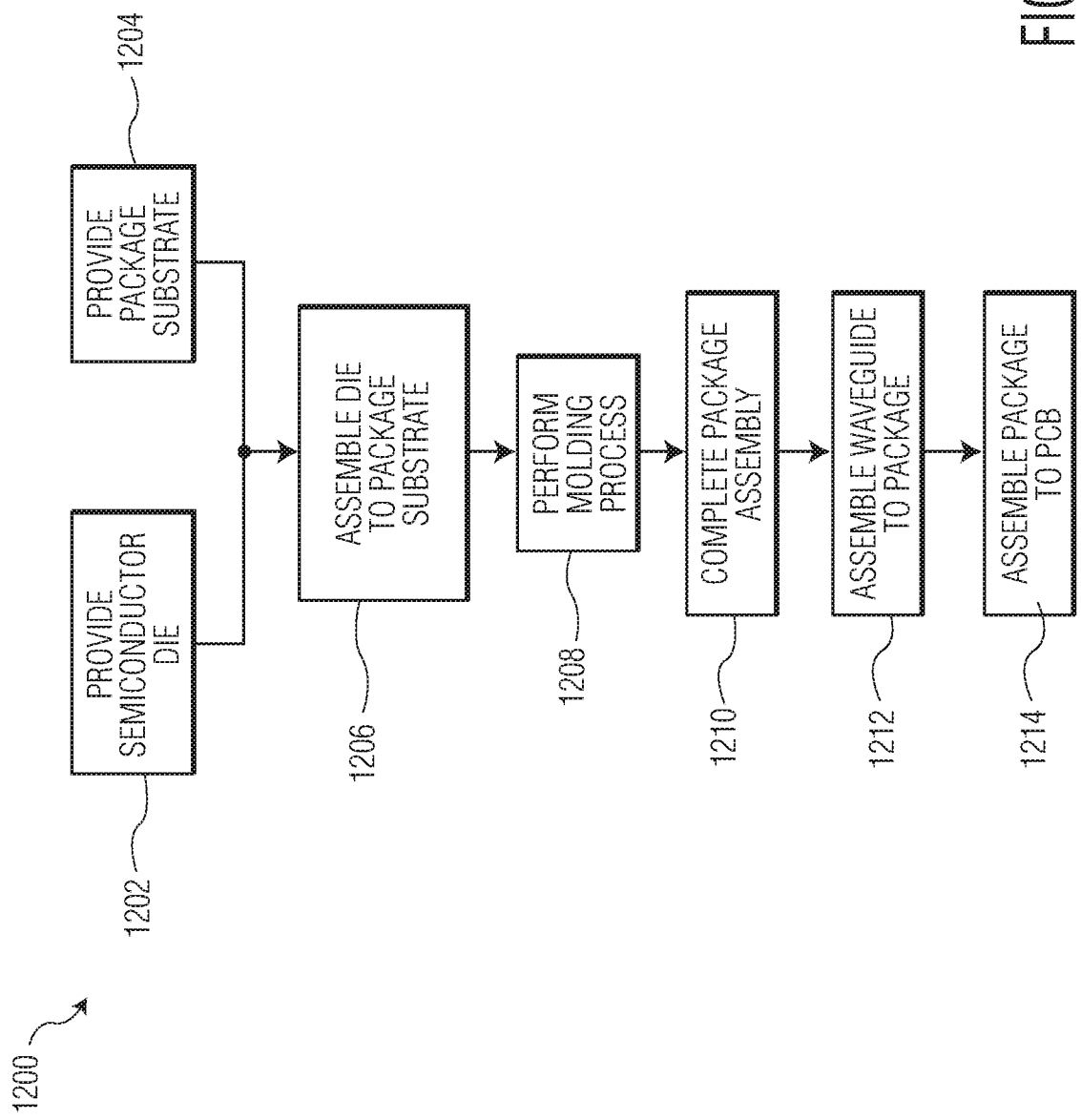

FIG. 12 illustrates, in flow diagram form, an alternative example method of forming a packaged semiconductor device with integrated waveguide in accordance with an embodiment. In this embodiment, the packaged semiconductor device includes a semiconductor die attached to a package substrate and is subjected to a molding process before a waveguide is attached to the package substrate.

At step 1202, provide the semiconductor die. In this embodiment, the semiconductor die includes bond pads at an active surface configured for connection to antenna radiators by way of a package substrate. The semiconductor die may be formed from any suitable semiconductor material, such as silicon, germanium, gallium arsenide, gallium nitride and the like. Semiconductor die may further include any digital circuits, analog circuits, RF circuits, memory, signal processor, MEMS, sensors, the like, and combinations thereof.

At step 1204, provide the package substrate. In this embodiment, the package substrate is a pre-formed substrate including a redistribution layer such as a metal interconnect layer. In an alternative embodiment, the package substrate may be formed as a build-up substrate. In yet another embodiment, the package substrate may be configured to incorporate one or more waveguides. Antenna radiators and bond terminal pads are formed at a first major surface of the package substrate and ball terminal pads are formed at a second major surface of the package substrate. The antenna radiators are electrically connected to bond pads of the semiconductor die by way of the redistribution layer.

At step 1206, assemble semiconductor die to the package substrate. In this embodiment, the semiconductor die is attached at a first portion of the package substrate in a flip-chip configuration Conductive pillars such as copper pillars, nanotubes, solder bumps, and the like are used to connect bond pads of the semiconductor die to respective bond terminal pads on the package substrate. With the semiconductor die attached, a conductive path is formed between the antenna radiator and the semiconductor die.

At step 1208, perform the molding process. In this embodiment, a gap formed between the semiconductor die and the package substrate is underfilled. The underfill molding process includes dispensing an epoxy material which is drawn into the gap by way of capillary action. In an alternative embodiment, the semiconductor die and a portion of the package substrate are over-molded with an epoxy material encapsulant. The over-molding process may utilize film-assisted molding (FAM) to form an opening in the encapsulant for subsequent attachment of a waveguide. The opening is formed such that the antenna radiator is exposed. In an embodiment, the over-molding process may occur after the underfill molding process.

At step 1210, complete package assembly. In this embodiment, conductive ball connectors (e.g., solder balls) are attached to the package substrate at ball terminal pads. The ball connectors are connected at ball terminal pads using known techniques and materials. Alternatively, ball connectors may be formed from any suitable conductive structure such as gold studs, copper pillars, and the like.

At step 1212, assemble waveguide to package. In this embodiment, the waveguide is pre-formed and attached to the package substrate at the opening formed in the encapsulant. The waveguide is configured having an air cavity formed in a waveguide substrate to allow an antenna radiator to be exposed when assembled. Dimensions (e.g., width, length) of the waveguide air cavity may be configured for propagation of signals (e.g., radar signals 76-81 GHz) having desired wavelengths. The waveguide substrate may be formed from a non-conductive material (e.g., ceramic, FR-4). A conductive (e.g., metal or other conductive material) layer is formed on sidewalls of the air cavity. The conductive layer formed on sidewalls is coupled to a supply terminal of the package substrate. The waveguide is attached to the package substrate at bond terminal pads by way of conductive connectors (e.g., solder, ECA, ACF).

At step 1214, assemble package to a PCB. In this embodiment, the packaged semiconductor device is attached to a printed circuit board, for example. Ball connectors affixed to the package substrate are attached to the PCB configured to form conductive paths between conductive features of the packaged semiconductor device and conductive features of the PCB.

Generally, there is provided, a method of manufacturing a packaged semiconductor device including attaching a semiconductor die to a package substrate, a bond pad of the semiconductor die coupled to an antenna radiator formed on the package substrate; attaching a waveguide to the package substrate, an opening of the waveguide having sidewalls substantially surrounding the antenna radiator; and depositing an epoxy material over at least a portion of the package substrate, the opening of the waveguide remaining void of epoxy material. The sidewalls of the waveguide may be characterized as conductive sidewalls formed from a conductive material, and wherein the attaching the waveguide further includes connecting the conductive sidewalls to a ground supply terminal located on the substrate. The depositing the epoxy material may include underfilling a gap formed between the semiconductor die and the substrate. The attaching the waveguide step may occur after the depositing the epoxy material step. The depositing the epoxy material may include over-molding the semiconductor die and at least a portion of the substrate. The dimensions of the waveguide opening may be configured for propagation of a mmWave signal. The attaching the waveguide step may include attaching the waveguide to the package substrate by using solder, electrically conductive adhesive (ECA), or anisotropic conductive film (ACF). The opening of the waveguide may be formed after the depositing the epoxy material step. The package substrate may be characterized as a pre-formed or a build-up substrate including a redistribution layer configured for coupling the bond pad with the antenna radiator.

In another embodiment, there is provided, a method of manufacturing a packaged semiconductor device including attaching a semiconductor die to a package substrate, a bond pad of the semiconductor die coupled to an antenna radiator formed at a surface of the package substrate; attaching a waveguide to the package substrate, an opening of the waveguide having conductive sidewalls substantially surrounding the antenna radiator; and depositing an epoxy material over at least a portion of the package substrate, the epoxy material in direct contact with the package substrate. The waveguide may include a waveguide substrate having conductive sidewalls substantially surrounding an opening in the waveguide substrate, and wherein the attaching the waveguide may further include forming an electrical connection between the conductive sidewalls and a ground supply terminal located on the package substrate. The depositing the epoxy material may include underfilling a gap formed between the semiconductor die and the substrate. The depositing the epoxy material may further include over-molding the semiconductor die and at least a portion of the substrate. The dimensions of the waveguide opening may be configured for transmitting or receiving a radar signal. The package substrate may be characterized as a pre-formed substrate including a redistribution layer configured for coupling the bond pad with the antenna radiator. The attaching the semiconductor die and attaching the waveguide may be attaching the semiconductor die and the waveguide to a same major surface of the package substrate.

In yet another embodiment, there is provided, a packaged semiconductor device including a package substrate having a first major surface and a second major surface; a semiconductor die having an active surface and a backside surface, the semiconductor die attached to the package substrate; a waveguide attached to the package substrate at the first major surface, an opening of the waveguide having conductive sidewalls; an antenna radiator at first major surface of the package substrate coupled to the semiconductor die by way of the package substrate, the antenna radiator exposed in the opening of the waveguide; and an epoxy material encapsulating at least a portion of the package substrate. The package substrate may be characterized as a pre-formed or a build-up substrate including a redistribution layer configured to couple a bond pad on the active surface of the semiconductor die with the antenna radiator. The semiconductor die attached to the package substrate may include the active surface of the semiconductor die attached at the first major surface or the second major surface of the package substrate. The conductive sidewalls of the waveguide may be connected to a ground supply terminal at the package substrate.

By now, it should be appreciated that there has been provided a packaged semiconductor device with integrated waveguide. A semiconductor die and pre-formed waveguide are attached to a pre-formed package substrate. The semiconductor die is attached to the package substrate in a flip-chip arrangement. An antenna radiator is exposed in an air cavity formed in the waveguide allowing for efficient propagation (e.g., transmit and/or receive) of radar (e.g., wwWave) signals. By integrating the waveguide into/onto the package, required application circuit board space is minimized and overall costs are significantly reduced.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of manufacturing a packaged semiconductor device, the method comprising:
    attaching a semiconductor die to a package substrate, a bond pad of the semiconductor die coupled to an antenna radiator formed on the package substrate;
    attaching a waveguide to the package substrate, an opening of the waveguide having sidewalls substantially surrounding the antenna radiator; and
    depositing an epoxy material over at least a portion of the package substrate, the opening of the waveguide remaining void of epoxy material.

2. The method of claim 1, wherein the sidewalls of the waveguide are characterized as conductive sidewalls formed from a conductive material, and wherein the attaching the waveguide further comprises connecting the conductive sidewalls to a ground supply terminal located on the substrate.

3. The method of claim 1, wherein depositing the epoxy material comprises underfilling a gap formed between the semiconductor die and the substrate.

4. The method of claim 1, wherein the attaching the waveguide step occurs after the depositing the epoxy material step.

5. The method of claim 1, wherein depositing the epoxy material comprises over-molding the semiconductor die and at least a portion of the substrate.

6. The method of claim 1, wherein dimensions of the waveguide opening are configured for propagation of a mmWave signal.

7. The method of claim 1, wherein the attaching the waveguide step comprises attaching the waveguide to the package substrate by using solder, electrically conductive adhesive (ECA), or anisotropic conductive film (ACF).

8. The method of claim 1, wherein the opening of the waveguide is formed after the depositing the epoxy material step.

9. The method of claim 1, wherein the package substrate is characterized as a pre-formed or a build-up substrate comprising a redistribution layer configured for coupling the bond pad with the antenna radiator.

10. A method of manufacturing a packaged semiconductor device, the method comprising:
    attaching a semiconductor die to a package substrate, a bond pad of the semiconductor die coupled to an antenna radiator formed at a surface of the package substrate;
    attaching a waveguide to the package substrate, an opening of the waveguide having conductive sidewalls substantially surrounding the antenna radiator; and
    depositing an epoxy material over at least a portion of the package substrate, the epoxy material in direct contact with the package substrate.

11. The method of claim 10, wherein the waveguide comprises a waveguide substrate having conductive sidewalls substantially surrounding an opening in the waveguide substrate, and wherein the attaching the waveguide further comprises forming an electrical connection between the conductive sidewalls and a ground supply terminal located on the package substrate.

12. The method of claim 10, wherein depositing the epoxy material comprises underfilling a gap formed between the semiconductor die and the substrate.

13. The method of claim 12, wherein depositing the epoxy material further comprises over-molding the semiconductor die and at least a portion of the substrate.

14. The method of claim 10, wherein dimensions of the waveguide opening are configured for transmitting or receiving a radar signal.

15. The method of claim 10, wherein the package substrate is characterized as a pre-formed substrate comprising a redistribution layer configured for coupling the bond pad with the antenna radiator.

16. The method of claim 15, wherein attaching the semiconductor die and attaching the waveguide are attaching the semiconductor die and the waveguide to a same major surface of the package substrate.

17. A packaged semiconductor device comprising:
    a package substrate having a first major surface and a second major surface;
    a semiconductor die having an active surface and a backside surface, the semiconductor die attached to the package substrate;
    a waveguide attached to the package substrate at the first major surface, an opening of the waveguide having conductive sidewalls;
    an antenna radiator at first major surface of the package substrate coupled to the semiconductor die by way of the package substrate, the antenna radiator exposed in the opening of the waveguide; and
    an epoxy material encapsulating at least a portion of the package substrate.

18. The packaged semiconductor device of claim 17, wherein the package substrate is characterized as a pre-formed or a build-up substrate comprising a redistribution layer configured to couple a bond pad on the active surface of the semiconductor die with the antenna radiator.

19. The packaged semiconductor device of claim 17, wherein the semiconductor die attached to the package substrate includes the active surface of the semiconductor die attached at the first major surface or the second major surface of the package substrate.

20. The packaged semiconductor device of claim 17, wherein the conductive sidewalls of the waveguide are connected to a ground supply terminal at the package substrate.

\* \* \* \* \*